United States Patent
Sakai et al.

(10) Patent No.: US 8,139,789 B2
(45) Date of Patent: Mar. 20, 2012

(54) SIGNAL AMPLIFIER CIRCUIT

(75) Inventors: Mitsuteru Sakai, Kyoto (JP); Yosuke Sato, Kyoto (JP)

(73) Assignee: Rohm Co., Ltd. (JP)

( * ) Notice: Subject to any disclaimer, the term of this patent is extended or adjusted under 35 U.S.C. 154(b) by 915 days.

(21) Appl. No.: 12/175,159

(22) Filed: Jul. 17, 2008

(65) Prior Publication Data
US 2009/0022337 A1  Jan. 22, 2009

(30) Foreign Application Priority Data

Jul. 19, 2007 (JP) ................................. 2007-187930

(51) Int. Cl.
*H03G 3/00* (2006.01)

(52) U.S. Cl. ........... 381/104; 381/81; 381/84; 381/94.5; 381/107

(58) Field of Classification Search .............. 381/81–85, 381/94.5, 104, 107; 700/94
See application file for complete search history.

(56) References Cited

U.S. PATENT DOCUMENTS

| | | | | |
|---|---|---|---|---|
| 4,448,074 A | * | 5/1984 | Schmidt | 73/585 |
| 4,481,660 A | * | 11/1984 | de Koning et al. | 381/58 |
| 4,683,591 A | * | 7/1987 | Dawson et al. | 381/85 |
| 5,182,465 A | * | 1/1993 | Stanley | 307/115 |
| 2007/0108374 A1 | * | 5/2007 | Fukuda et al. | 250/214 A |

FOREIGN PATENT DOCUMENTS

| | | |
|---|---|---|
| JP | 11-340759 A | 12/1999 |
| JP | 2004-222077 A | 8/2004 |
| JP | 2005-117489 A | 4/2005 |
| JP | 2005-217710 A | 8/2005 |

* cited by examiner

*Primary Examiner* — Kimberly Nguyen
*Assistant Examiner* — Duy Nguyen
(74) *Attorney, Agent, or Firm* — Cantor Colburn LLP

(57) ABSTRACT

A plurality of main amplifiers amplifies input audio signals with an adjustable gain. A first selector selects any of the input audio signals. An auxiliary amplifier receives an output of the first selector and amplifies this output with an adjustable gain. A second selector receives n outputs from the main amplifiers and selects any of the outputs. A soft switching circuit receives an output of the second selector at a first input terminal, receives an output of the auxiliary amplifier at a second input terminal, and makes the output transition gradually from one of the input terminals to the other of the input terminals. Output switches are respectively provided for the main amplifiers, an output of a corresponding main amplifier is received at a first input terminal, an output of the soft switching circuit is received at a second input terminal, and one of the outputs is selected to be outputted.

8 Claims, 2 Drawing Sheets

SIGNAL AMPLIFIER CIRCUIT

BACKGROUND OF THE INVENTION

1. Field of the Invention

The present invention relates to a signal amplifier circuit which amplifies an electrical signal such as an audio signal or the like.

2. Description of the Related Art

Electronic devices having an audio signal reproduction function, such as CD players, audio amplifiers, and car stereos, or portable radios, portable audio players, and the like, are generally provided with a volume control for adjusting sound volume, an equalizer for adjusting frequency response, or the like. Control of the volume or equalizer is carried out by varying audio signal amplitude.

An audio signal is amplified by an amplifier, and is ultimately outputted as sound from a speaker or headphone, which are electroacoustic transducer devices. Adjustment of volume is realized by controlling amplifier gain, or controlling attenuation rate of an attenuator. For example, Patent Documents 1 and 2 disclose an electronic volume circuit in which gain of an amplifier or attenuation rate of an attenuator are realized by switching resistance value of a variable resistor. Furthermore, Patent Document 3 discloses technology for controlling an electronic volume circuit of this type.

Patent Document 1: Japanese Patent Application Laid Open No. 2005-117489
Patent Document 2: Japanese Patent Application Laid Open No. 2005-217710
Patent Document 3: Japanese Patent Application Laid Open No. 2004-222077
Patent Document 4: Japanese Patent Application Laid Open No. H11-340759

When sound volume is changed from a certain initial value to a certain target value, a resistance value of a variable resistor of an electronic volume control is switched from a value corresponding to the initial value to a value corresponding to the target value. At this time, if the resistance value is rapidly switched, voltage value of an audio signal outputted from an amplifier changes rapidly and a signal component occurs in an audible spectrum, which causes noise to be generated. This problem can occur even in cases other than those of audio signals.

SUMMARY OF THE INVENTION

The present invention has been made in consideration of the related problems, and a general purpose thereof is to provide a signal amplifier circuit in which amplitude of an electrical signal can be gradually switched.

An embodiment of the present invention relates to an amplifier circuit in which a plurality of input signals are amplified with a gain separately set for each signal. The signal amplifier circuit includes: n main amplifiers (n is an integer greater than or equal to 2) which receive n input signals and amplify each of the input signals with respective adjustable gains; a first selector which receives the n input signals and selects any of the n input signals; an auxiliary amplifier which receives an output of the first selector and amplifies the output with an adjustable gain; a second selector which receives n outputs from the n main amplifiers, and selects any of the n outputs; a soft switching circuit which receives an output of the second selector at a first input terminal, receives an output of the auxiliary amplifier at a second input terminal, and makes an output transition gradually from one of the input terminals to the other of the input terminals; n output switches which are provided for the respective n main amplifiers, each output switch receiving an output of a corresponding main amplifier at a first input terminal, and receiving the output of the soft switching circuit at a second input terminal, to select and to output one of the outputs; and a controller which controls gain of the n main amplifiers and the auxiliary amplifier, selection states of the first selector, the second selector, the soft switching circuit, and the output switches.

According to this embodiment, it is possible to independently and gradually switch amplitude of a plurality of input signals. Moreover, since one auxiliary amplifier and one soft switching circuit may be provided for the plurality of main amplifiers, it is possible to reduce circuit area.

When gain of an i-th input signal (i is an integer, $1 \leq i \leq n$) is changed to a target gain, the controller, in a first state, may make the first selector select the i-th input signal and make the soft switching circuit select a signal at the first input terminal, and also may switch an output of an i-th output switch from a signal at the first input terminal to a signal at the second input terminal; in a second state, may set gain of the auxiliary amplifier to the target gain, and in a state in which the second selector is made to select an output of the i-th main amplifier, may make an output of the soft switching circuit transition from a signal at the first input terminal to a signal at the second input terminal; in a third state, in a state in which gain of the i-th main amplifier is set to the target gain, may make an output of the soft switching circuit transition from a signal at the second input terminal to a signal at the first input terminal; and, in a fourth state, may switch an output of the i-th output switch from a signal at the second input terminal to a signal at the first input terminal.

The n output switches may be operable to select signals of both the first and the second input terminals simultaneously, and the controller, in the first state, when an output of the i-th output switch is switched from a signal at the first input terminal to a signal at the second input terminal, may cause simultaneous selection of the signals at the first and the second input terminals; and in the third state, when an output of the i-th output switch is switched from a signal at the second input terminal to a signal at the first input terminal, may cause simultaneous selection of the signals at the first and the second input terminals.

The first selector may receive a predetermined fixed voltage in addition to the n input signals, and the controller, in the fourth state, may make the first selector select the fixed voltage.

The controller may execute a transition of the third state at a faster speed than the transition of the second state.

Another embodiment of the present invention is an audio system. The audio system includes an audio signal source which generates an n-channel audio signals; the signal amplifier circuit which amplifies the n-channel audio signals from the audio signal source; and a plurality of electroacoustic transducer devices that are driven by an audio signal amplified by the signal amplifier circuit.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state in which "member A is connected to member B" includes cases in which the member A and the member B are directly and physically connected, and cases in which the member A and the member B are indirectly connected via another member that does not affect an electrical connection state. In a similar way, "a state in which member C is arranged (or provided) between member A and member B" includes, in addition to cases in which the member A and the member C, or the member B and the member C are directly connected, cases in which the members are indirectly connected via another member that does not affect an electrical connection state.

Figure 1:
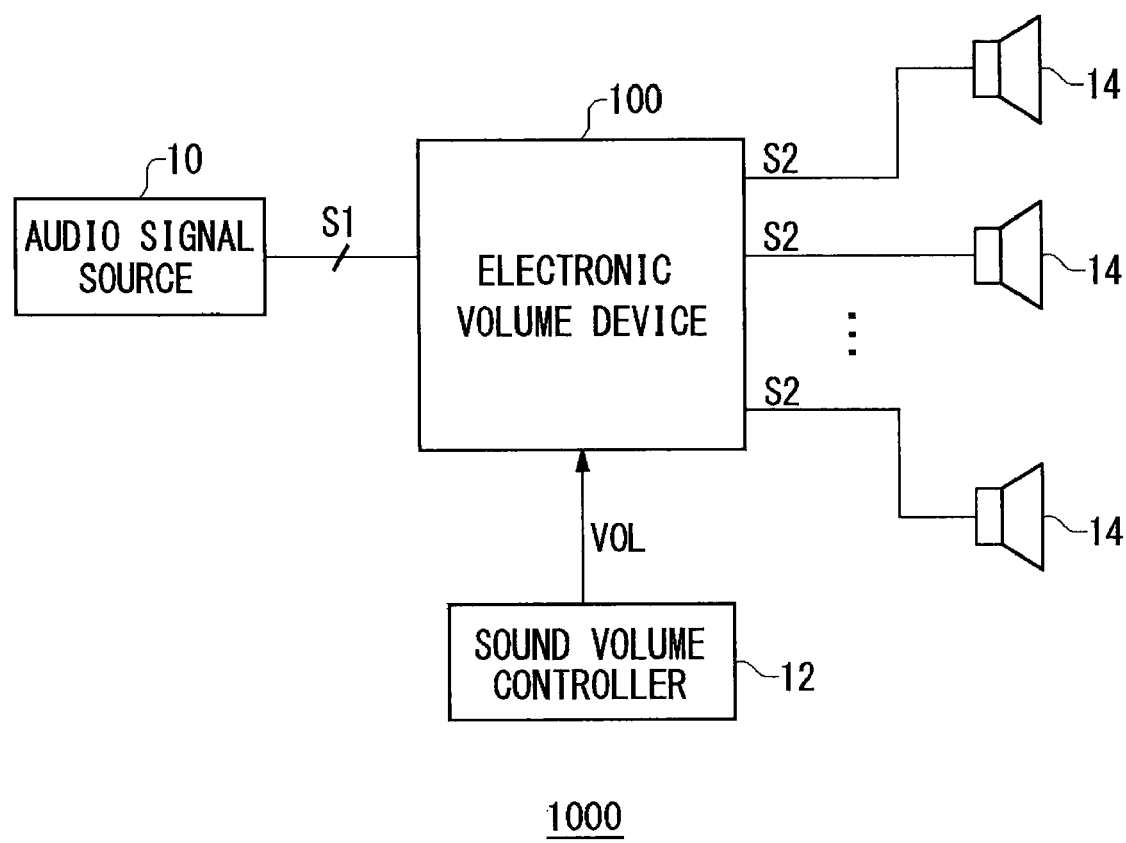
FIG. 1 is a block diagram showing an overall configuration of an audio system in which an electronic volume device according to an embodiment is used.

FIG. 1 is a block diagram showing an overall configuration of an audio system 1000 in which an electronic volume device 100 according to an embodiment is used. The audio system 1000 is an apparatus provided with a means for outputting sound, such as an audio amplifier, a car stereo, a portable audio player, a mobile telephone, or the like. The electronic volume device 100 according to the embodiment is installed in the audio system 1000, and adjusts volume of sound outputted from an electroacoustic transducer device such as a speaker, headphone, or the like.

The audio system 1000 is provided with an audio signal source 10, a sound volume controller 12, speakers 14, and an electronic volume device 100. For example, for a 5.1 channel surround audio system, there are 6 channels, front right, front left, front center, rear left, rear right, and subwoofer.

The audio signal source 10 performs reproduction processing, converting sound data stored in disk media, memory, or hard disk, or inputted from outside wirelessly or using wires, to n-channel (n is an integer, greater than or equal to 2) input audio signals Sin1-Sinn, which are analog. The sound volume controller 12 is an input device provided for a user to vary volume, and volume values VOL1-VOLn for each channel are designated via this sound volume controller 12.

The electronic volume device 100 is a signal amplifier circuit that respectively amplifies the multi-channel input audio signals Sin1-Sinn outputted from the audio signal source 10 according to volume values VOL1-VOLn, respectively outputted from the sound volume controller 12. The electronic volume device 100, as described later, includes main amplifiers which amplify or attenuate the audio signals Sin, and changes internal amplifier gains, in accordance with volume values VOL designated by the user. The plural speakers 14 are provided for respective channels, and are driven by audio signals Sout amplified by the electronic volume device 100. Power amplifiers and filters (not shown in the drawings) are arranged between the speakers 14 and the electronic volume device 100.

Figure 2:
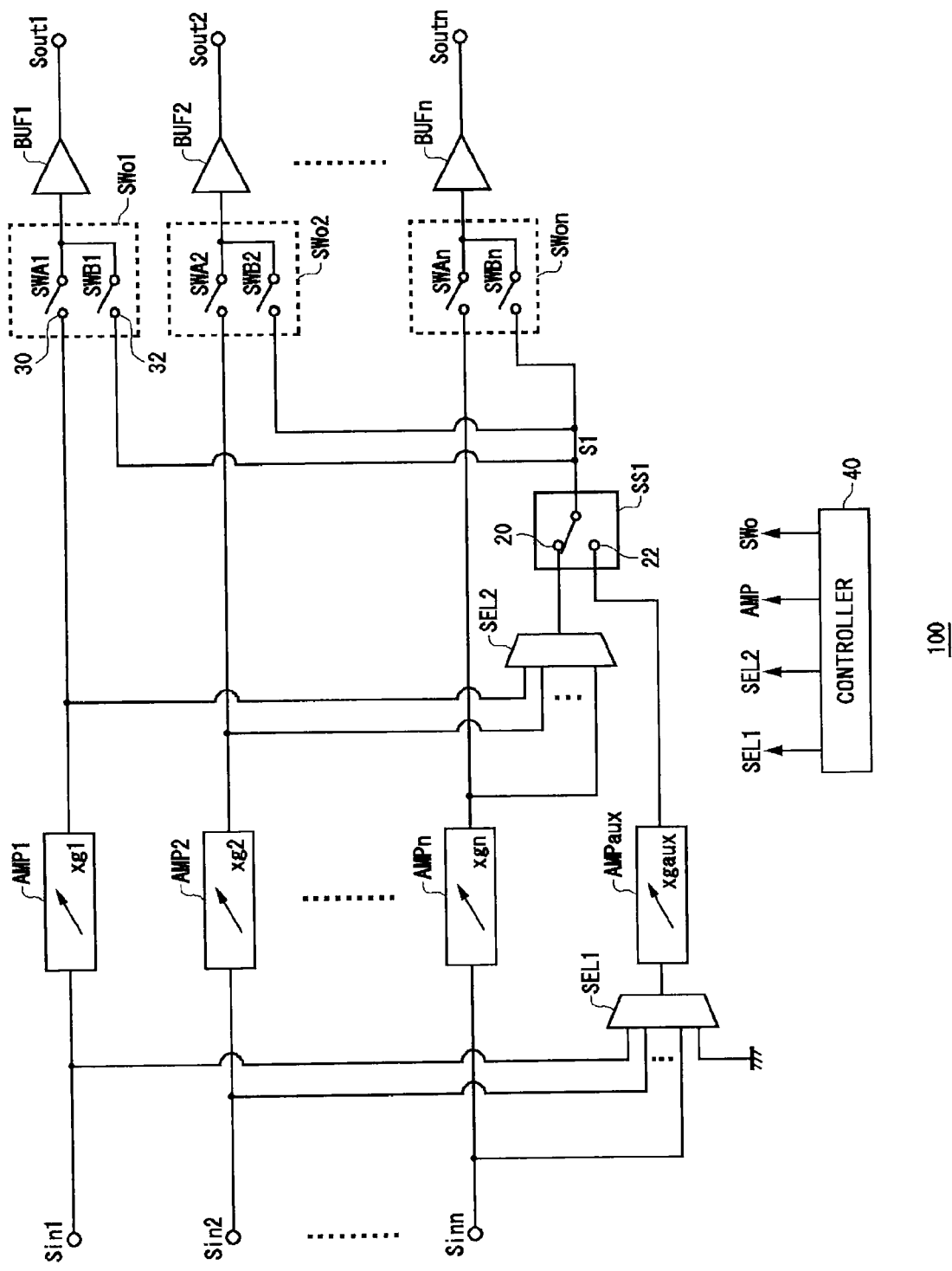
FIG. 2 is a block diagram showing a configuration of the electronic volume device according to the embodiment.

A detailed explanation is given below concerning a configuration of the electronic volume device 100. FIG. 2 is a block diagram showing a configuration of the electronic volume device 100 according to the embodiment. The electronic volume device 100 amplifies the n-channel input audio signals Sin1-Sinn with gains g1-gn set for respective channels, and outputs post-amplification audio signals Sout1-Soutn.

The electronic volume device 100 is provided with main amplifiers AMP1-AMPn (referred to collectively as simply AMP as necessary), output switches SWo1-SWon (referred to collectively as simply SWo as necessary), a first selector SEL1, a second selector SEL2, an auxiliary amplifier AMPaux, a soft switching circuit SS1, output buffers BUF1-BUFn (referred to collectively as simply BUF as necessary), and a controller 40. The electronic volume device 100 is a function IC integrated on one semiconductor substrate.

The n main amplifiers AMP1-AMPn are provided for the respective input audio signals Sin1-Sinn. The main amplifiers AMP1-AMPn are variable gain amplifiers, and their respective gains g1-gn are independently adjustable. The i-th main amplifier AMPi amplifies the i-th input audio signal Sini with a set gain gi.

Amplification here is a concept that includes not only cases in which gain is larger than 1, but also includes attenuation of 1 or less. Therefore, the amplifier refers to a concept that includes an attenuator, and has a wide meaning of a circuit in which amplification of an electronic signal is changed. The gain gi of the main amplifier AMPi is selected from a plurality of gains that are discretely set.

The first selector SEL1 receives the n input audio signals Sin1-Sinn, and selects and outputs any of the n input audio signals.

The auxiliary amplifier AMPaux receives an output of the first selector SEL1 and amplifies this output. Gain gaux of the auxiliary amplifier AMPaux is adjustable, similar to the main amplifiers AMP.

The selector SEL2 receives an output from the n main amplifiers AMP1-AMPn, and selects and outputs any output thereof. The soft switching circuit SS1 is provided with a first input terminal 20 and a second input terminal 22. The soft switching circuit SS1 receives an output of the second selector SEL2 at the first input terminal 20, and receives an output of the auxiliary amplifier AMPaux at the second input terminal 22. The soft switching circuit SS1 makes its output S1 transition gradually from a signal at the first input terminal side to a signal at the second input terminal side.

Output switches SWo1-SWon are provided for respective main amplifiers AMP1-AMPn. Each output switch SWo is provided with a first input terminal 30 and a second input terminal 32. The i-th output switch SWo receives an output of the corresponding main amplifier AMPi at the first input terminal 30, and receives the output S1 of the soft switching circuit SS1 at the second input terminal 32. The output switch SWo selects and outputs a signal of either the first input terminal 30 or the second input terminal 32.

The output buffers BUF1-BUFn are provided for each output switch SWo1-SWon, and the output buffers drive speakers that are externally connected.

The controller 40 controls the gains g1-gn of the main amplifiers AMP1-AMPn, the gain gaux of the auxiliary amplifier AMPaux, and selection states of the first selector SEL1, the second selector SEL2, the soft switching circuit SS1, and the output switches SWo1-SWon.

The main amplifiers AMP and the auxiliary amplifier AMPaux can be configured by using a variable resistor. Below, several configuration examples are explained.

In a certain exemplary embodiment, a plurality of resistors are connected in series, to form a resistor network. Potential of one end of the resistor network is fixed, and the audio signals Sin are applied to the other end. A plurality of switches is provided for respective connection nodes of adjacent resistors, and attenuation is controlled by turning a discretional switch ON.

Furthermore, another exemplary embodiment can be configured as a noninverting amplifier that uses an operational amplifier. Audio signals Sin are inputted to a noninverting input terminal of the operational amplifier. A reference voltage is applied via a resistor to an inverting input terminal of the operational amplifier. Moreover, a feedback resistor is arranged between the inverting input terminal and an output terminal of the operational amplifier. In such cases, it is possible to control gain by having at least one of the resistor or the feedback resistor as a variable resistor.

Furthermore, another exemplary embodiment can be configured as an inverting amplifier that uses an operational amplifier. In such cases, an audio signal Sin is inputted via an input resistor to an inverting input terminal of the operational amplifier, and a reference voltage is applied to a noninverting input terminal. Furthermore, a feedback resistor is arranged between the inverting input terminal and an output terminal of the operational amplifier. In such cases, it is possible to control gain by having at least one of the input resistor or the feedback resistor as a variable resistor.

In this way, in the present embodiment, configurations of the main amplifiers AMP and the auxiliary amplifier AMPaux are not particularly limited to a certain form, and configurations are possible in which a plurality of gains that are set discretely can be switched.

The output switches SWo are such that signals at both the first input terminal 30 and the second input terminal 32 can be selected at the same time. In order to realize this, the output switches SWo are provided with 2 switches SWA and SWB, and by turning both switches SWA and SWB ON, both signals at the first input terminal 30 and the second input terminal 32 are selected.

Operation of the electronic volume device 100 configured as above will be explained. Here, operation is explained for cases in which gain of the i-th input audio signal Sini is changed from an initial gain gi(init) to a target gain gi(tgt).

In an initial state, the gain of the main amplifier AMPi is set to gi(init), and the output switch SWoi selects and outputs a signal of the first input terminal 30. That is, the i-th input audio signal Sini is outputted via the main amplifier AMPi and the switch SWA of the output switch SWoi.

A volume value VOLi indicating the target gain gi(tgt) from the sound volume controller 12 is inputted to the controller 40. The controller 40, in a first state, first makes the first selector SEL1 select the i-th input audio signal Sini. In addition, the second selector SEL2 is made to select a signal of the i-th main amplifier AMPi. Furthermore, the soft switching circuit SS1 is made to select a signal of the first input terminal 20. The output of the i-th output switch SWoi is switched from a signal of the first input terminal 30 to a signal of the second input terminal 32. As a result, in a first state, the input audio signal Sini is outputted via the main amplifier AMPi, the second selector SEL2, the first input terminal 20, and the switch SWBi of the output switch SWoi.

In a following second state, the gain gaux of the auxiliary amplifier AMPaux is set to a target gain gi(tgt). The controller 40, in a state in which the second selector SEL2 is made to select an output of the i-th main amplifier AMPi, makes the output S1 of the soft switching circuit SS1 transition from a signal at the input terminal 20 to a signal at the second input terminal 22.

In a state in which the soft switching circuit SS1 selects a signal at the first input terminal 20, a signal amplified with the initial gain gi(init) by the main amplifier AMPi is outputted, from an output buffer BUFi. In a state in which the soft switching circuit SS1 selects a signal at the second input terminal 22, a signal amplified with the target gain gi(tgt) by the auxiliary amplifier AMPaux is outputted from the output buffer BUFi.

Therefore, by gradually switching the output S1 of the soft switching circuit SS1 from the first input terminal 20 to the second input terminal 22, it is possible to gradually switch gain with respect to the input audio signal Sini from gi(init) to gi(tgt).

In a third state, the controller 40 switches the gain gi of the i-th main amplifier AMPi from the initial gain gi(init) to gi(tgt). In this state the controller 40 makes the output S1 of the soft switching circuit SS1 transition from a signal at the second input terminal 22 to a signal at the first input terminal 20. In the third state, since the gain of the main amplifier AMPi and the auxiliary amplifier AMPaux are both set to the target gain gi(tgt), a change in sound volume due to switching of the soft switching circuit SS1 does not occur.

After the third state, the input audio signal Sini is amplified with the target gain gi(tgt) by the main amplifier AMPi, and is outputted via the second selector SEL2, the first input terminal 20, and the switch SWBi of the output switch SWoi. That is, the auxiliary amplifier AMPaux is released.

In a fourth state, the output of the i-th output switch SWoi is switched from a signal at the second input terminal 32 to a signal at the first input terminal 30. As a result, the input audio signal Sini is amplified by the target gain gi(tgt) by the main amplifier AMPi, and is outputted via the switch SWAi of the output switch SWoi.

In addition, the controller 40 may perform control as follows.

In the first state, when the output of the i-th output switch SWoi is switched from a signal at the first input terminal 30 to a signal at the second input terminal 32, the controller 40 may select signals at the first input terminal 30 and the second input terminal 32 at the same time.

In addition, in the third state, when the output SWoi of the i-th output switch is switched from a signal at the second input terminal 32 to a signal at the first input terminal 30, signals at the first input terminal 30 and the second input terminal 32 may be selected at the same time.

By selecting the first input terminal 30 and the second input terminal 32 at the same time, it is possible to curtail output level of the output switch SWoi from fluctuating rapidly, and generation of noise can be further curtailed.

Furthermore, the first selector SEL1 may receive a predetermined fixed voltage (ground voltage) in addition to the n input audio signals Sin1-Sinn. The controller 40, in the fourth state, preferably makes the first selector SEL1 select ground voltage.

In such cases, since input level of the auxiliary amplifier AMPaux is fixed, it is possible to prevent unnecessary signal input to the soft switching circuit SS1, and furthermore, it is possible to curtail noise.

In addition, the controller 40 may carry out transition for the soft switching circuit SS1 in the third state at a higher speed than transition in the second state. In the transition of the third state, since the same signal is inputted to the first input terminal 20 and the second input terminal 22, even if transition is performed at high speed, almost no noise is generated. Therefore, by carrying out translation at a high speed, it is possible to shorten time required for changing volume.

Operation of the electronic volume device 100 is as above. According to the electronic volume device 100 according to the present embodiment, it is possible to make an arbitrary channel volume transition while curtailing noise.

In addition, according to the electronic volume device 100 of FIG. 2, the following effect can be obtained.

In the electronic volume device 100, the common auxiliary amplifier AMPaux and the soft switching circuit SS1 are provided for the plurality of main amplifiers AMP1 to AMPn. Supposing a case in which the electronic volume device 100 according to the present embodiment is not used, it is necessary to provide a main amplifier AMP and an auxiliary amplifier AMPaux for each channel. That is, if there is an n-channel audio system, n auxiliary amplifiers AMPaux and n soft switching circuits SS1 are necessary, and circuit area increases. In contrast to this, in the electronic volume device 100 of FIG. 2, since one auxiliary amplifier AMPaux is provided for the plurality of main amplifiers AMP, circuit area can be made small.

The present invention has been explained above, based on the embodiment. The embodiment is an example, and a person skilled in the art will understand that various modified examples in combinations of various component elements and various processes thereof are possible, and that such modified examples are within the scope of the present invention. Such a modified example is explained below.

In the embodiment, the signal amplifier circuit was explained for cases using audio signal volume setting, but the present invention is not limited to this and can be applied to an arbitrary signal whose amplitude has to be gradually changed.

While the preferred embodiments of the present invention have been described using specific terms, such description is for illustrative purposes only, and it is to be understood that changes and variations may be made without departing from the spirit or scope of the appended claims.

What is claimed is:

1. A signal amplifier circuit comprising:
   n main amplifiers (n is an integer greater than or equal to 2) which receive n input signals and amplify each of the input signals with respective adjustable gains;
   a first selector which receives the n input signals and selects any of the n input signals;
   an auxiliary amplifier which receives an output of the first selector and amplifies the output with an adjustable gain;
   a second selector which receives n outputs from the n main amplifiers, and selects any of the n outputs;
   a soft switching circuit which receives an output of the second selector at a first input terminal, receives an output of the auxiliary amplifier at a second input terminal, and makes an output of the soft switching circuit transition gradually from one of the input terminals to another of the input terminals;
   n output switches which are provided for the respective n main amplifiers, each output switch receiving an output of a corresponding main amplifier at a first input terminal of the output switch and receiving the output of the soft switching circuit at a second input terminal of the output switch, to select and to output one of the outputs; and
   a controller which controls gain of the n main amplifiers and the auxiliary amplifier, and selection states of the first selector, the second selector, the soft switching circuit, and the output switches.

2. The signal amplifier circuit according to claim 1, wherein, when gain of an i-th input signal (i is an integer, $1 \leq i \leq n$) is changed to a target gain, the controller:
   in a first state, makes the first selector select the i-th input signal and makes the soft switching circuit select a signal at the first input terminal of the soft switching circuit, and also switches an output of an i-th output switch from a signal at the first input terminal of the output switch to a signal at the second input terminal of the output switch;
   in a second state, sets gain of the auxiliary amplifier to the target gain, and in a state in which the second selector is made to select an output of the i-th main amplifier, makes an output of the soft switching circuit transition from a signal at the first input terminal of the soft switching circuit to a signal at the second input terminal of the soft switching circuit;
   in a third state, in a state in which gain of the i-th main amplifier is set to the target gain, makes an output of the soft switching circuit transition from a signal at the second input terminal of the soft switching circuit to a signal at the first input terminal of the soft switching circuit; and
   in a fourth state, switches an output of the i-th output switch from a signal at the second input terminal of the output switch to a signal at the first input terminal of the output switch.

3. The signal amplifier circuit according to claim 2, wherein, the n output switches are operable to select signals of both the first and the second input terminals of the output switches simultaneously, and the controller
   in the first state, when an output of the i-th output switch is switched from a signal at the first input terminal of the output switch to a signal at the second input terminal of the output switch, causes simultaneous selection of the signals at the first and the second input terminals; and
   in the third state, when an output of the i-th output switch is switched from a signal at the second input terminal of the output switch to a signal at the first input terminal of the output switch, causes simultaneous selection of the signals at the first and the second input terminals.

4. The signal amplifier circuit according to claim 2, wherein,
   the first selector receives a predetermined fixed voltage in addition to the n input signals, and
   the controller, in the fourth state, makes the first selector select the fixed voltage.

5. The signal amplifier circuit according to claim 2, wherein,
   the controller executes a transition of the third state at a faster speed than the transition of the second state.

6. The signal amplifier circuit according to claim 1, wherein the signal amplifier circuit is monolithically integrated on one semiconductor substrate.

7. The signal amplifier circuit according to claim 1, wherein the input signals are audio signals.

8. An audio system comprising:
   an audio signal source which generates an n-channel audio signals;
   the signal amplifier circuit according to claim 7 which amplifies the n-channel audio signals from the audio signal source; and
   a plurality of electroacoustic transducer devices that are driven by the audio signal amplified by the signal amplifier circuit.

* * * * *